(12) United States Patent
Kamatani et al.

(10) Patent No.: US 7,108,924 B2
(45) Date of Patent: Sep. 19, 2006

(54) POLYMER COMPOUND AND ELECTROLUMINESCENT ELEMENT

(75) Inventors: Jun Kamatani, Kanagawa (JP); Shinjiro Okada, Kanagawa (JP); Akira Tsuboyama, Kanagawa (JP); Takao Takiguchi, Tokyo (JP); Satoshi Igawa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/407,438

(22) Filed: Apr. 7, 2003

(65) Prior Publication Data

US 2003/0224208 A1    Dec. 4, 2003

Related U.S. Application Data

(63) Continuation of application No. PCT/JP03/03616, filed on Mar. 25, 2003.

(30) Foreign Application Priority Data

Mar. 26, 2002  (JP)  ............... 2002-085662

(51) Int. Cl.
H01L 51/54 (2006.01)
H05B 33/14 (2006.01)
C09K 11/06 (2006.01)

(52) U.S. Cl. ............... 428/690; 428/917; 428/500; 428/523; 313/504; 313/506; 257/40; 257/E51.027; 257/E51.036; 257/E51.044; 526/241; 526/259; 526/265; 252/301.35; 528/423

(58) Field of Classification Search ............... 428/690, 428/917, 500, 523; 313/504, 506; 257/40; 252/301.35; 526/241, 265; 528/423
See application file for complete search history.

(56) References Cited

U.S. PATENT DOCUMENTS

| | | | |
|---|---|---|---|
| 2002/0190250 A1* | 12/2002 | Grushin et al. | 257/40 |
| 2003/0072964 A1* | 4/2003 | Kwong et al. | 428/690 |
| 2003/0148142 A1* | 8/2003 | Fryd et al. | 428/690 |
| 2004/0072018 A1* | 4/2004 | Herron et al. | 428/690 |

FOREIGN PATENT DOCUMENTS

| | | |
|---|---|---|
| JP | 2000-239318 | 9/2000 |
| JP | 2002-56975 | 2/2002 |
| JP | 2003-113246 | 4/2003 |
| WO | 03/001616 | 1/2003 |

OTHER PUBLICATIONS

U.S. Appl. No. 60/330,815.*
U.S. Appl. No. 60/337,160.*
U.S. Appl. No. 60/337,161.*
U.S. Appl. No. 60/399,934.*
K.D. Ley, et al., "Photophysics of Metal-Organic π-Conjugated Polymers", Coordination Chem. Rev., vol. 171, pp. 287-307 (1998), no month.
C. Lee, et al., "Polymer Electrophosphorescent Devices Using a Copolymer of Ir(ppy)$_2$-Bound 2-(4-Vinylphenyl)pyridine with N-vinylcarbazole", 3$^{rd}$ Int'l Conf. on Electroluminescence of Molecular Materials and Related Phenomena, Sep. 5-8, 2001, abstract No. 0-18.
Sergey Lamansky et al., "Synthesis and Characterization of Phosphorescent Cyclometalated Iridium Complexes," 40 *Inorg. Chem.* 1704-11 (2001).

* cited by examiner

*Primary Examiner*—Marie Yamnitzky
(74) *Attorney, Agent, or Firm*—Fitzpatrick, Cella, Harper & Scinto

(57) ABSTRACT

There is provided a polymer compound in which a metal complex is bonded to a main chain of a polymer via a substituent for imparting a given distance therebetween. Specifically, a polymer compound is provided which has a partial structure represented by the general formula (1):

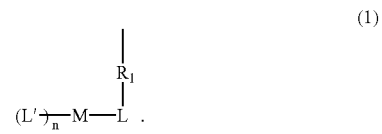

It is thus rendered possible to improve the yield of synthesis of the polymer compound and to introduce a desired metal complex in a predetermined amount into the polymer compound. It is thus made possible to realize a white-light emitting material or a light emission of a desired color.

9 Claims, 1 Drawing Sheet

FIGURE
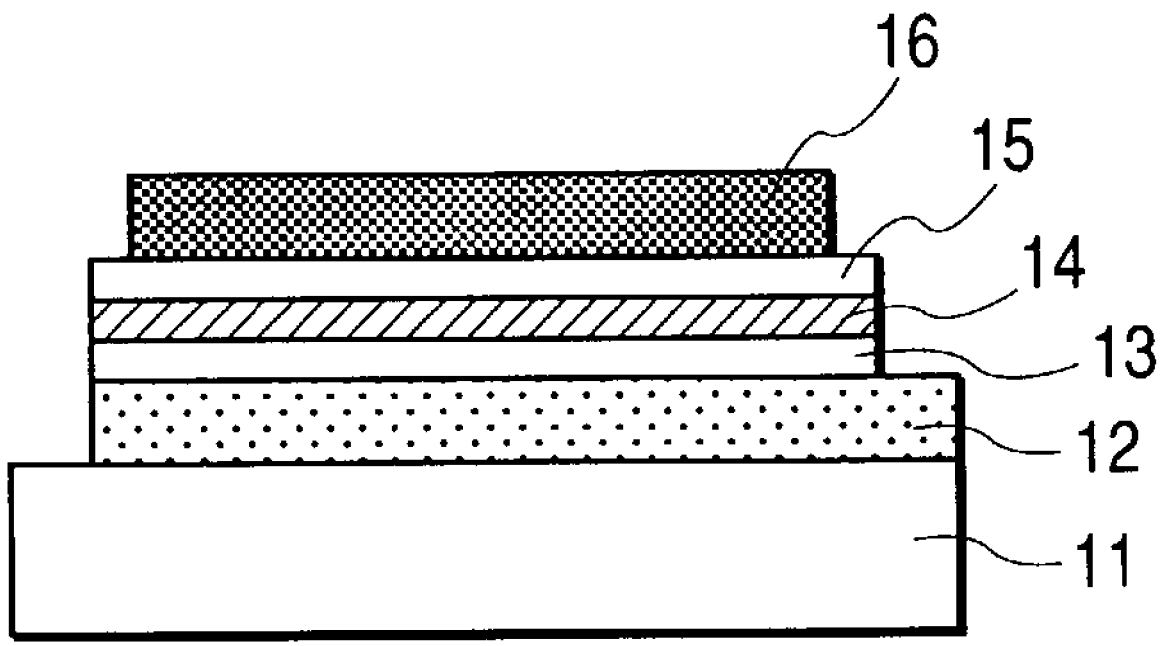

POLYMER COMPOUND AND ELECTROLUMINESCENT ELEMENT

This application is a continuation of International Application No. PCT/JP03/03616, filed Mar. 25, 2003.

BACKGROUND OF THE INVENTION

1. Field of the Invention

The present invention relates to an electroluminescent element (or device) adapted for use in a flat light source, a flat display, or the like. In particular, the present invention relates to a light emitting element utilizing a polymer compound as a light emitting material, and, more specifically, it relates to a light emitting element with improved stability and light emitting efficiency by employing a polymer compound having a metal bond as a light emitting material.

2. Related Background Art

Of the electroluminescent elements, an element utilizing an organic substance as a light emitting material is called an organic electroluminescent element or an organic EL element. Such an organic EL element is being actively developed for realization of the element, including material development therefor, since it has advantages of easier increase of size, light emission of a desired color by the development of various new materials and drive with a lower voltage in comparison with an inorganic EL element, and is promising as a light emitting element of a high-speed response and a high light emitting efficiency.

In the following description, following abbreviations will be used for various materials which have following names and structures shown in the following chemical formula I:

Alq3: aluminum-quinolinol complex;
α-NPD: N4,N4'-di-naphthalen-1-yl-N4,N4'-diphenyl-biphenyl-4,4'-diamine;
CBP: 4,4'-N,N'-dicarbazole-biphenyl;
BCP: 2,9-dimethyl-4,7-diphenyl-1,10-phenanthroline;
PtOEP: platinum-octaethylporphyrin complex;
Ir(ppy)3: iridium-phenylpyridine complex;

Chemical Formula I

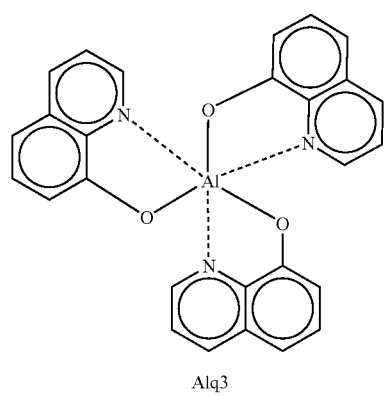

Alq3

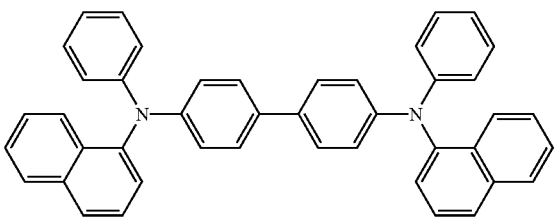

α-NPD

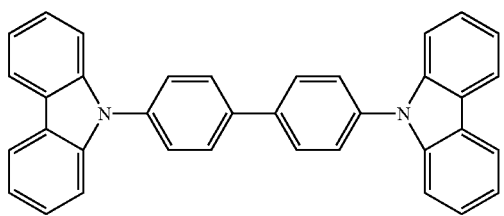

CBP

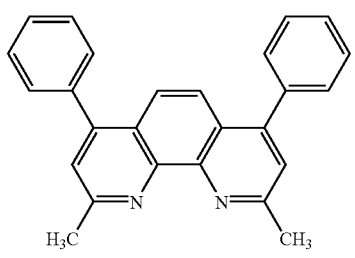

BCP

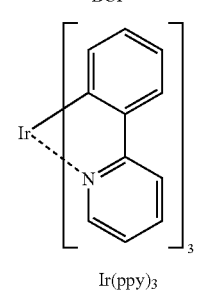

Ir(ppy)₃

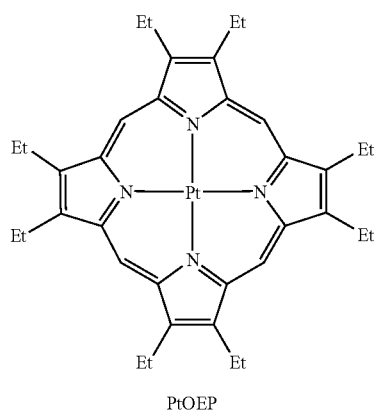

PtOEP

Currently, in order to increase the light emission luminance of the organic EL element, there is required development of a novel light emitting material for the organic EL element. From such a standpoint, attention is being paid, in addition to the conventional fluorescent light emitting materials, to phosphorescent light emitting materials for which a high light emitting efficiency can be expected in principle.

Also, there have been proposed those light emitting substances which are formed by incorporating a metal complex capable of emitting light upon application of an electric field or the like into a polymer material.

The present invention is characterized by employing a polymer compound containing a metal complex as a light emitting substance. Hitherto, as a polymer compound containing a metal complex, there have been known light emitting polymer materials disclosed in the following document 1.

Document 1: Photophysics of metal-organic π-conjugated polymers, K. D. Ley et al., Coordination Chemistry Reviews, 171 (1998), pp. 287–307

Document 1 reports measurement of photoluminiscence using the following compound and also suggests application to an organic EL element.

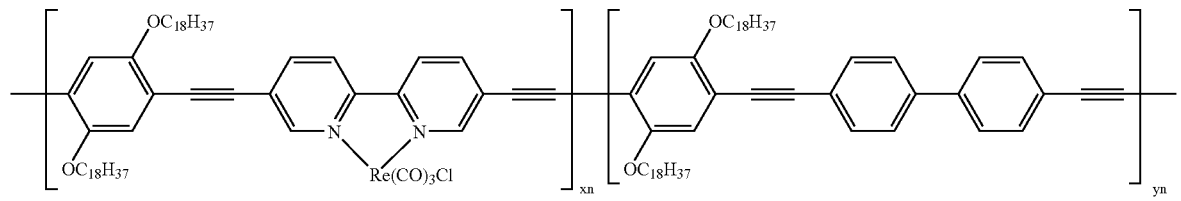

P0: x = 0, y = 1.0          P25: x = 0.25, y = 0.75

P10: x = 0.1, y = 0.9       P50: x = 0.5, y = 0.5

In the organic EL element of a low molecular type which is now in the main stream of the development, a light emitting material is formed on a substrate by vacuum evaporation. However, if such a polymer compound is made available, it will become possible to produce an organic EL element by a coating method, thereby leading to a significant cost reduction.

However, based on the experience of the present inventors, the compound described in the aforementioned Document 1 is estimated to lack stability because of instability of the C=O bonds contained in the Re complex. Also it is estimated to lack photostability because a triple bond is contained in the main chain of the polymer compound.

On the other hand, a report on O-17 by C. L. Lee et al. in the following document 2 discloses synthesizing a polymer compound having a phenylpyridine group on a side chain and then adding a metal complex thereto to synthesize a polymer compound having a metal complex in the side chain.

Document 2: C. L. Lee et al., "Polymer electrophotoluminescent devices using a copolymer of Ir(ppy)2-bound2-(4-vinylphenyl)pyridine with N-vinylcarbazole"; 3rd International Conference on Electro-luminescence of Molecular materials and Related Phenomena (Sep. 5th–8th, 2001).

However, it is estimated to be difficult to prepare a desired polymer by this technique, because a proportion of adding the complex (called introduction rate) is difficult to control and it is difficult to simultaneously introduce metal complexes of plural kinds into a polymer.

In consideration of the foregoing, it is, therefore, an object of the present invention to provide a polymer compound, having a high stability and containing a metal complex as a light emitting substance, with a high reproducibility and a high yield.

It is another object of the present invention to incorporate a light emitting metal complex with an arbitrary structure into a polymer compound, thereby obtaining a predetermined structure with an improved light emitting efficiency and also obtaining a predetermined color of light emission.

SUMMARY OF THE INVENTION

In order to attain the aforementioned objects, the present inventors have employed, in adding a light emitting metal complex to a polymer compound, a method of coupling to a main chain of the polymer compound via a substituent of a certain length (hereinafter, simply referred to as "spacer").

The present inventors aimed to at first synthesize a monomer having a spacer and to facilitate formation of a polymer by a condensation reaction, thereby improving the yield of synthesis.

The present invention provides a novel polymer compound having a main chain and a side chain, wherein the side chain comprises a partial structure represented by the general formula (1):

wherein $R_1$ represents a linear or branched alkylene group having 2 to 15 carbon atoms (in which only a single methylene group or two or more non-adjacent methylene groups may be substituted with —O—, —S—, —CO—, —CO—O—, —O—CO—, —CH=CH—, or —C≡C—, and in which a hydrogen atom may be substituted with a fluorine atom), or an aromatic ring group that may have a substituent (the substituent being a halogen atom, a cyano group, a nitro group or a linear or branched alkyl or alkylene group having 1 to 20 carbon atoms (in which only a single methylene group or two or more non-adjacent methylene groups may be substituted with —O—, —S—, —CO—, —CO—O—, —O—CO—, —CH=CH—, or —C≡C—, and a hydrogen atom of the alkyl group may be substituted with a fluorine atom));

M represents a metal atom which is Ir, Pt, Rh, or Pd;

L and L' (L≠L') each represent a ligand that is coordinatable with a metal; and n represents 1 or 2.

More specifically, the present invention provides a polymer compound comprising a partial structure represented by the general formula (2):

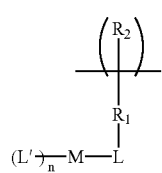

(2)

wherein $R_2$ represents a hydrogen atom, a linear or branched alkyl group that may be substituted, a cycloalkyl group, an aryl group, an aralkyl group, or an aromatic group.

The present invention also provides an electroluminescent element comprising a pair of electrodes provided on a substrate, and a light emitting layer provided between the electrodes and comprising at least one organic compound, wherein the organic compound comprises at least one of the aforementioned polymer compounds of the present invention.

In the present invention, it is preferred that L' of the partial structure of the general formula (1) comprises a partial structure represented by the general formula (3):

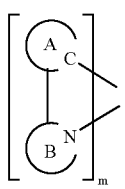

(3)

wherein N represents a nitrogen atom; C represents a carbon atom; A represents a cyclic group, that may have a substituent, connected to the metal atom M through the carbon atom; B represents a cyclic group that may have a substituent {the substituent being a halogen atom, a cyano group, a nitro group, a trialkylsilyl group (in which each alkyl group is independently a linear or branched alkyl group having 1 to 10 carbon atoms), a linear or branched alkyl group having 1 to 20 carbon atoms (in which only a single methylene group or two or more non-adjacent methylene groups may be substituted with —O—, —S—, —CO—, —CO—O—, —O—CO—, —CH=CH—, or —C≡C—, and in which a hydrogen atom of the alkyl group may be substituted with a fluorine atom), or an aromatic ring group that may have a substituent (the substituent being a halogen atom, a cyano group, a nitro group, or a linear or branched alkyl group having 1 to 20 carbon atoms (in which only a single methylene group or two or more non-adjacent methylene groups may be substituted with —O—, —S—, —CO—, —CO—O—, —O—CO—, —CH=CH—, or —C≡C—, and in which a hydrogen atom of the alkyl group may be substituted with a fluorine atom))}, attached to the metal atom M through the nitrogen atom; A and B are either covalently bonded or bonded via a carbon atom to each other; and m represents 1 or 2.

Also in the present invention, it is preferred that L' of the partial structure of the general formula (1) is any one of the structures represented by the general formulas (4):

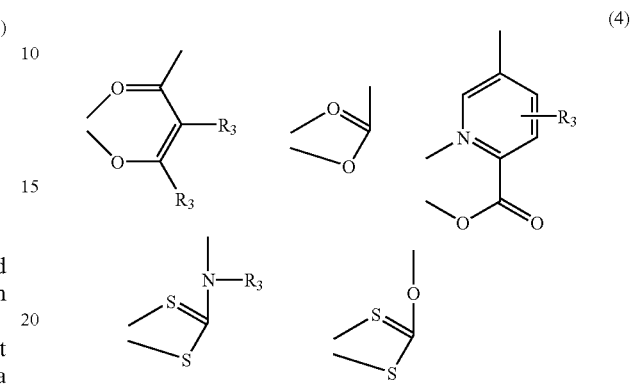

(4)

wherein $R_3$ represents a hydrogen atom, a substituent comprising a linear or branched alkyl or alkylene group, or an aromatic substituent.

In the present invention, it is further preferred that the polymer compound of the invention comprises a partial structure represented by the general formula (5):

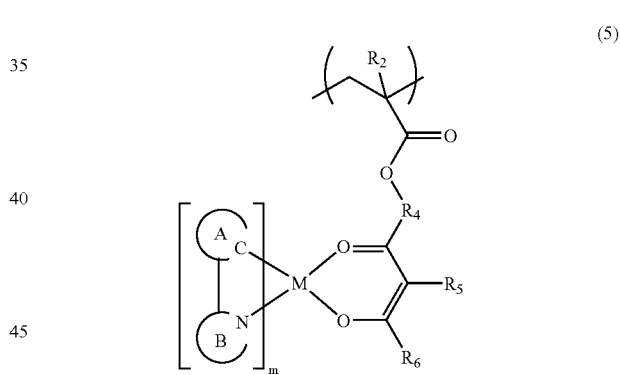

(5)

wherein M represents a metal atom which is Ir, Pt, Rh, or Pd; m represents 1 or 2; $R_2$ represents a hydrogen atom or a methyl group; $R_4$ represents a linear or branched alkyl group having 1 to 10 carbon atoms (in which only a single methylene group or two or more non-adjacent methylene groups may be substituted with —O—, —S—, —CO—, —CO—O—, —O—CO—, —CH=CH—, or —C≡C—, and in which a hydrogen atom of the alkyl group may be substituted with a fluorine atom); $R_5$ represents a hydrogen atom, a substituent comprising a linear or branched alkyl or alkylene group having 1 to 15 carbon atoms, or an aromatic substituent; and $R_6$ is a hydrogen atom, a substituent comprising a linear or branched alkyl or alkylene group having 1 to 6 carbon atoms, or an aromatic substituent.

Also in the polymer compound of the present invention, it is preferred that at least a monomer thereof has a structure represented by the general formula (6):

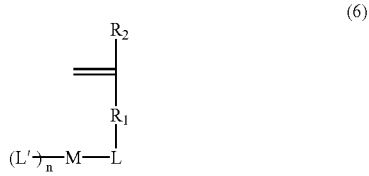

(6)

BRIEF DESCRIPTION OF THE DRAWING

FIGURE is a schematic cross-sectional view of a light emitting element employed for evaluation of the material of the present invention.

DESCRIPTION OF THE PREFERRED EMBODIMENTS

The present invention has been made, based on the finding of the present inventors that a fixation of a phosphorescence emitting metal complex in an appropriate concentration in a polymer compound with a spacer suppresses formation of excited polymers, thereby achieving a highly efficient light emission.

The polymer compound of the present invention includes, within the molecule thereof, atoms constituting a main chain of polymer and a metal complex bonded directly via the aforementioned spacer, and effects phosphorescence. The lowest excited state is considered to include a triplet MLCT* (Metal-to-Ligand Charge Transfer) excitation state and a π—π* excitation state.

Physical properties relating to fluorescence and phosphorescence used herein are measured in the following manner.

(1) Method for Judging Phosphorescence and Fluorescence

Phosphorescence was identified by deactivation with oxygen. A compound was dissolved in chloroform, and a solution subjected to replacement with oxygen and a solution subjected to replacement with nitrogen were irradiated with light and photoluminescence was compared. A phosphorescent substance can be identified by a fact that a light emission derived from the compound is scarcely observable in the solution after oxygen replacement while a photoluminescence can be confirmed in the solution after nitrogen replacement. All the compounds of the present invention shown below were confirmed to be phosphorescent by this method, unless specified otherwise.

(2) Phosphorescenct Yield Used Herein Can be Determined by a Following Equation:

$$\Phi(sample)/\Phi(st)=[Sem(sample)/Iabs(sample)]/[Sem(st)/Iabs(st)]$$

Φ(sample): emission yield of sample;
Φ(st): emission yield of standard sample;
Iabs(st): absorption coefficient of standard sample at an excitation wavelength thereof;
Sem(st): area intensity of emission spectrum of standard sample excited at the same wavelength;
Iabs(sample): absorption coefficient of objective sample at an excitation wavelength thereof;
Sem(sample): area intensity of emission spectrum of objective sample excited at the same wavelength The phosphorescent yield used herein refers to a relative value when taking Φ of Ir(ppy)$_3$ as 1 (standard).

(3) Phosphorescence Emission Lifetime Used Herein is Measured in the Following Manner.

At first a compound is dissolved in chloroform, and is spin coated in a thickness of about 0.1 μm on a quartz substrate. Then, an emission lifetime measuring apparatus, manufactured by Hamamatsu Photonics Co., is used to execute a pulse irradiation with a nitrogen laser light of an excitation wavelength of 337 nm at room temperature. Attenuation time of the emission light intensity after the application of the excitation pulse is measured.

For an initial light emission intensity $I_0$ and a light emission life τ, a light emission intensity I after t seconds is represented by:

$$I=I_0 exp(-t/\tau).$$

The polymer compounds of the present invention showed phosphorescent yields as high as 0.15 to 0.9, and the phosphorescence lifetime of 0.1 to 100 μs (microseconds) which is rather short for a phosphorescent substance.

The phosphorescence lifetime, if excessively large, induces an energy saturated state, thereby significantly deteriorating the light emission efficiency, and is therefore unsuitable for use in a light emission element. Also, in case of presence of a large number of molecules in a triplet excited state which is a stand-by state for light emission, there may result various competitive reactions involving energy deactivation, thereby resulting in lowering in the light emission efficiency. Particularly, there is a drawback that the light emission intensity decreases when the light emitting substance is present at a high concentration. This phenomenon is called concentration extinction and is considered to be caused by a model that a molecule of the light emitting substance in an excited state is deactivated by transferring the excitation energy to an adjacent molecule. Therefore, the deactivation occurs more easily as the number of such adjacent molecules increases, and the light emission intensity is not elevated despite of a large amount of the light emitting substance.

The present invention is featured by a novel light emitting material for an organic EL element, in which a phosphorescent substance in a form of a complex is fixed in a fixed proportion to a polymer compound, thereby reducing the aforementioned concentration extinction and providing characteristics of a stable light emission, a high phosphorescent efficiency and a relatively short phosphorescence lifetime.

Also, the material of the present invention can provide various light emission wavelengths depending on the structure of the unit of metal complex, and, by incorporating plural kinds of metal complex units of different structures together into the polymer compound, the material is expected to have a wide light-emission wavelength range through the combination of the plural light emission spectra obtained by such metal complex units.

In the following, the features of the polymer compound of the present invention will be explained.

In the polymer compound of the present invention, $R_2$ in the general formula (2) has the aforementioned definition and may preferably be a hydrogen atom, a methyl group, a cyano group, a methyl ester group etc. in consideration of ease of polymerization reaction, but is not limited to such examples.

Also, examples of the ligand L' in the aforementioned metal complex portion include phenylpyridine, thienylpyridine, phenylisoquinoline, acetylacetone, picolinic acid (2-pyridinecarboxylic acid), derivatives having these skeletons, derivatives having a phenyl group skeleton, and derivatives having a pyridine skeleton, as represented by the following chemical formulas 2.

Examples of the ligand L bonded with the spacer $R_1$ include those compounds which are shown in the following chemical formulas 3 and derivatives thereof.

Also, in the present invention, it is possible to further suppress the concentration extinction by introducing a substituent in each ligand, thereby increasing the distance between the ligands.

It is also possible to use a polymer compound having plural kinds of phosphorescent materials incorporated into the same molecule singly, or to use a mixture or dispersion of plural kinds of polymer compounds each having a phosphorescent portion. In such case, in order to suppress an energy deactivation by a transfer of the excitation energy from a light emitting portion of a longer emission wavelength to another light emitting portion of a shorter emission wavelength, it is also effective to introduce a substitute having a steric hindrance or an electric repulsive action such as alkyl group or fluorine atom into the ligand L or L'.

The term "ligand" used herein refers to an atomic group containing an atom which can conjugate with an atom bonded with a metal complex, while the term "spacer" means an atomic group within the metal complex, that does not conjugate with the ligand and that is other than an atomic group to be contained in the main chain at the time of polymerization.

Examples of $R_2$ to be employed for the aforementioned spacer portion include those having structures shown in the following chemical formulas 4.

Chemical Formulas 2

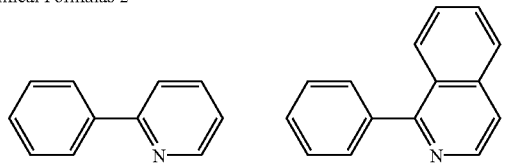

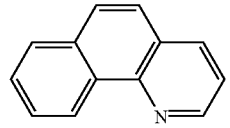

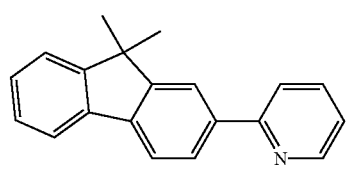

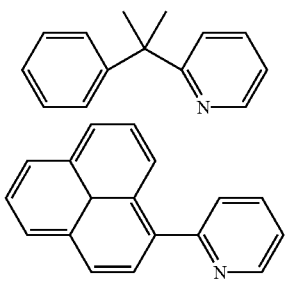

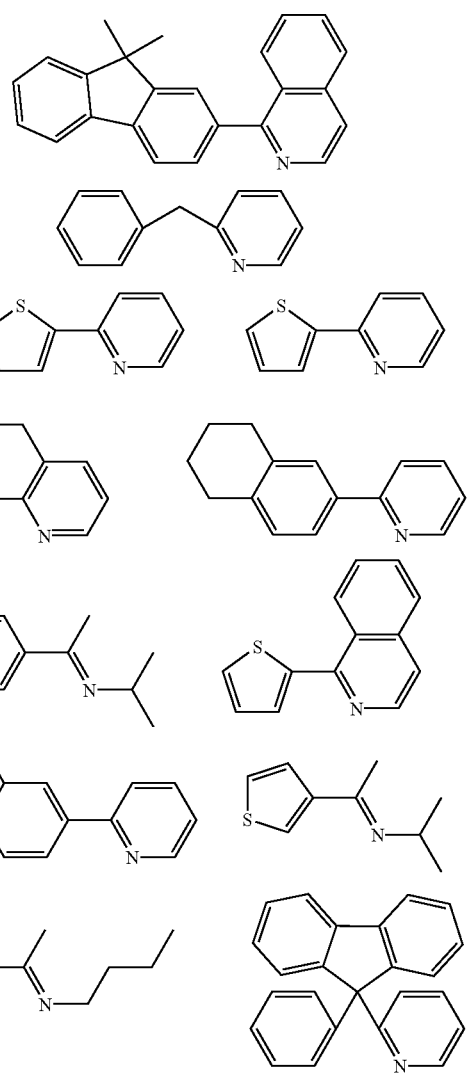

In these structures, each hydrogen atom may be substituted with F, $CF_3$, $OCF_3$, $OCH_3$, alkyl group or alkenyl group.

Chemical Formulas 3

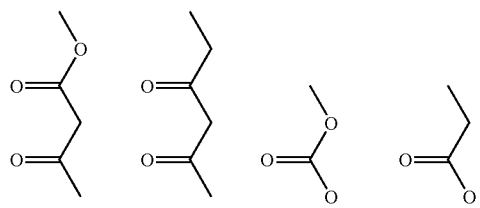

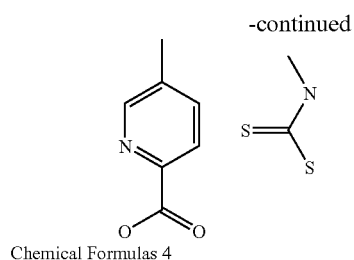
Chemical Formulas 4
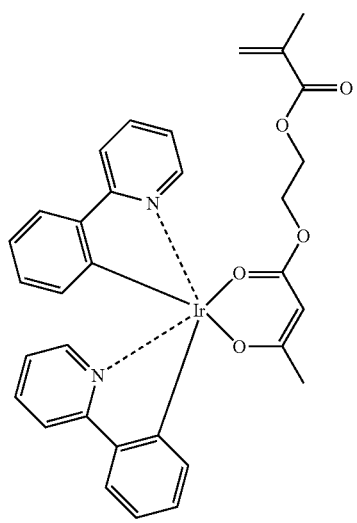
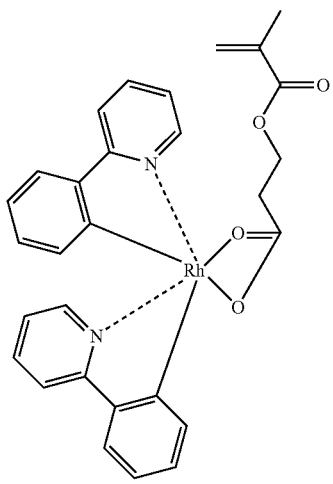
Examples of monomers having a metal complex structure formed by use of these ligands are shown in the following chemical formulas 5.
Chemical Formulas 5
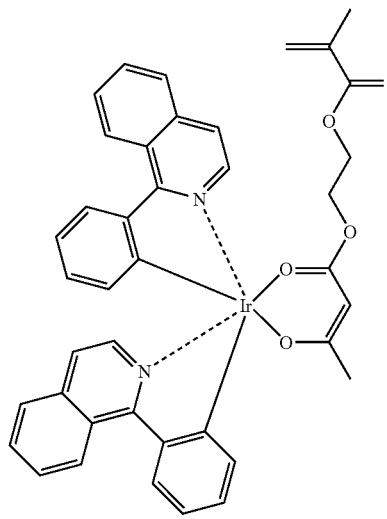
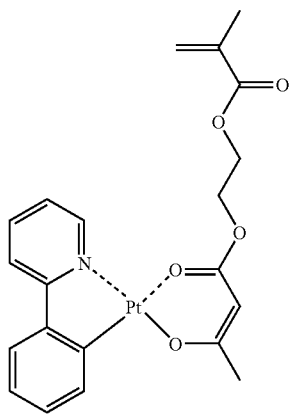

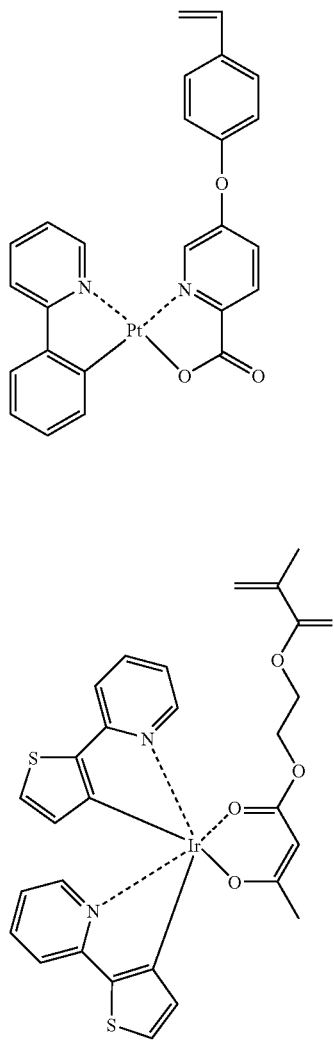

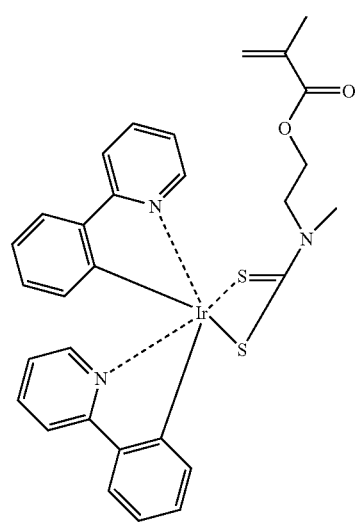

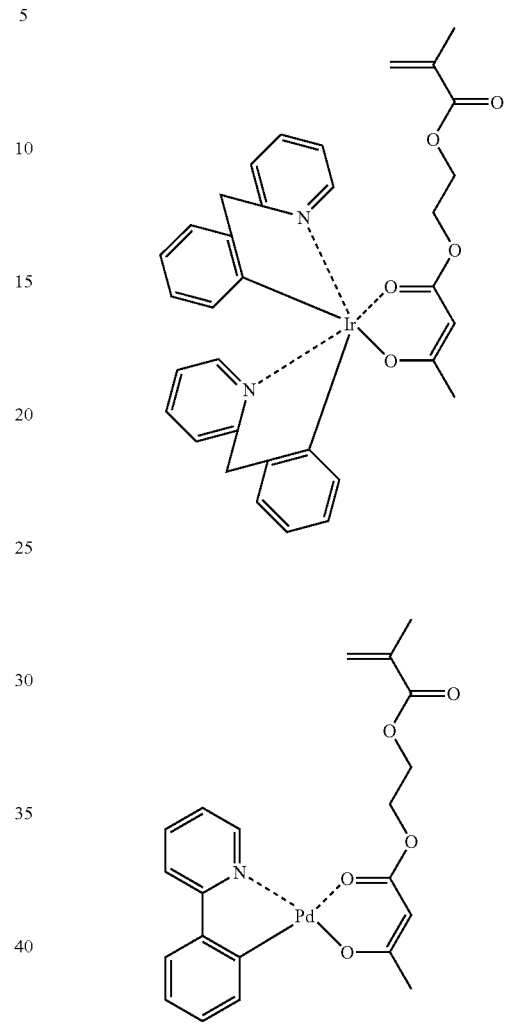

In these monomers, each hydrogen atom may be substituted with F, $CF_3$, $OCF_3$, $OCH_3$, or alkyl or alkenyl group.

Further, the present invention includes not only the polymer compounds having the aforementioned metal complexes, but also polymer compounds having metal complexes with other ligands, and polymer compounds having plural kinds of ligands.

Moreover, in the present invention, it is possible to use, as the light emitting material, a mixture of the polymer compound of the invention with another organic substance.

Also, the polymer compound of the present invention may be used as a mixture with a polymer compound or the like that is ordinarily used in a transfer layer, and, in this manner, there can be prepared a light emitting element of a wide light-emission wavelength range or a light emitting element of a high light-emission efficiency.

Such mixing of compounds of different structures also contributes to an improvement in film forming property, such as prevention of crystal precipitation in the composition during element preparation.

Examples of such polymer compounds include those compounds which are shown in the following chemical formulas 6, for example PPV (polyparaphenylenevinylene), its derivatives such as RO-PPV, CN-PPV, and MEH-PPV; PAT (polythiophene), its derivatives such as PEDOT, PCHMT, POPT, PTOPT, PDCHT and PCHT; PPP (polyparaphenylene), its derivatives such as RO—PPP and FP-PPP; PDAF (polydialkylfluorene); PVK (polyvinylcarbazole); polyacetylene derivatives such as PPA, PDPA and PAPA; polysilane sigma-conjugated polymers such as PDBS, PDHS, PMPS and PBPS; polysilol; or triphenylamine polymers such as TPDPES and TPDPEK.

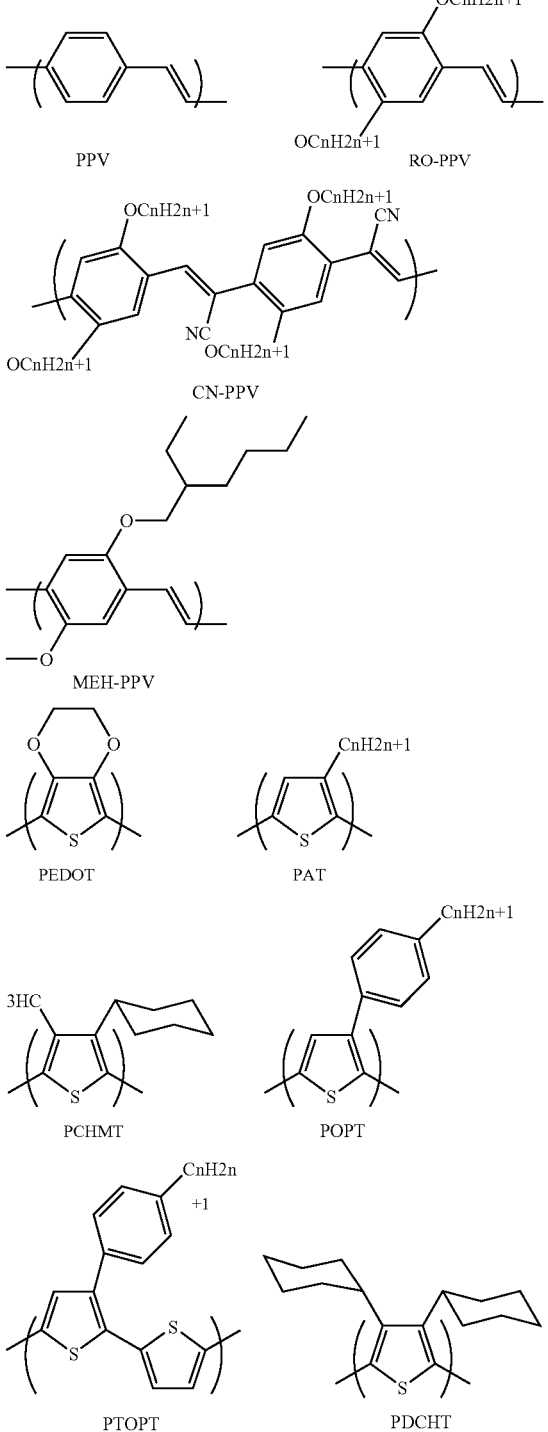

Chemical Formulas 6

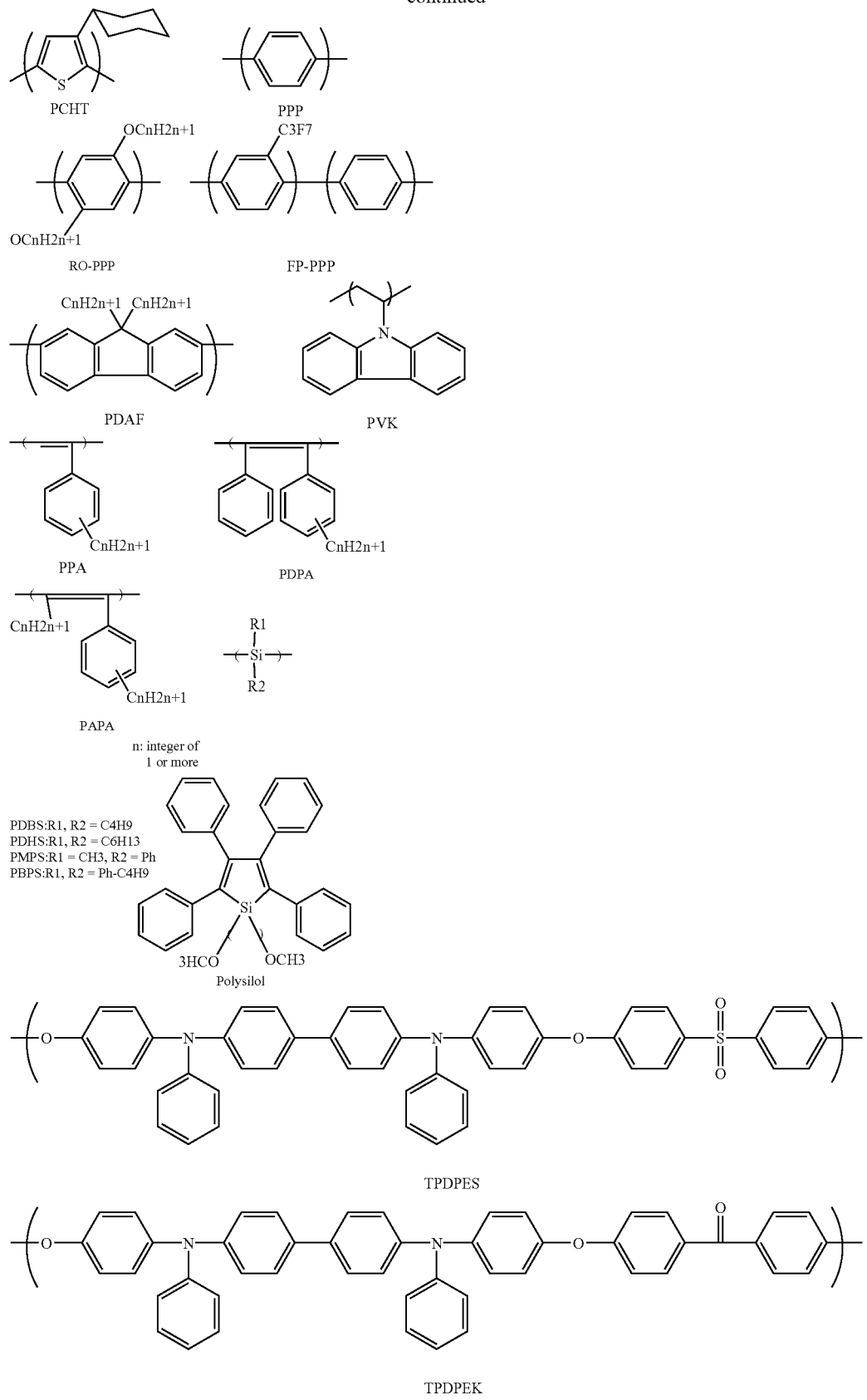

As the general characteristics of the polymer reaction, formation of various bonds is anticipated in the bonding of the monomer and the metal complex mentioned above, so that the structure of the reaction product is naturally not limited to those mentioned above.

Also, the degree of polymerization varies depending on the reaction conditions, so that the molecular weight can be varied from about several thousands to about several millions, and all these products are included in the scope of the present invention.

However, in the preparation of the organic EL element of the present invention, a light emitting layer containing the polymer compound of the present invention has to be formed as a film on a substrate. In such operation, an excessively small molecular weight is undesirable because of drawbacks such as a deficient wetting property at the coating operation by spin coating or with an ink jet, or a tendency of causing a film peeling off after the coating. On the other hand, a molecular weight exceeding one million results in drawbacks such as difficulty in dissolution in a solvent used for coating and causing precipitation, and an excessively high viscosity of the solution deteriorating the coating property. Consequently a molecular weight within a range of about 2,000 to 1,000,000 is easy to use and preferred, and more preferably about 3,000 to 200,000.

Also the monomer to be copolymerized with the metal complex associated with the light emission can be any polymerizable monomer, but can be, for example, vinylcarbazole or methyl methacrylate shown in the following chemical formulas 7. Also, by the use of at least one monomer having an ionic group, namely a water-soluble monomer, such as an alcohol, a carboxylic acid, a sulfonic acid, an amine or a salt thereof as shown in the following chemical formulas 8, hydrophilicity can be imparted to the polymer to achieve easier use for coating using, for example, the ink jet method.

Chemical Formulas 7

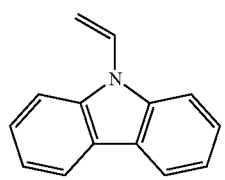
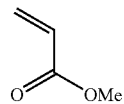
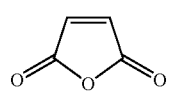
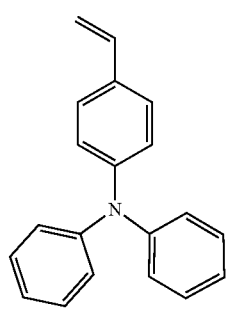

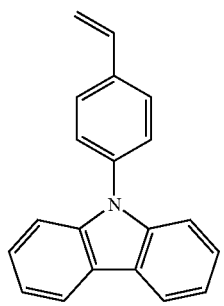
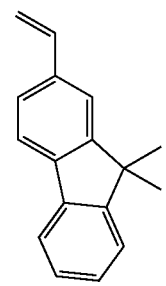

Chemical Formulas 8

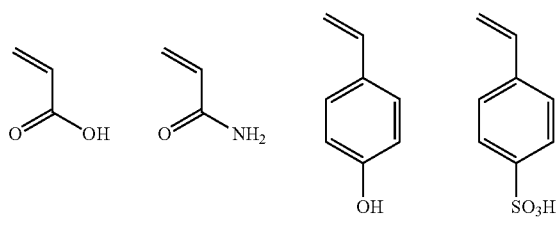
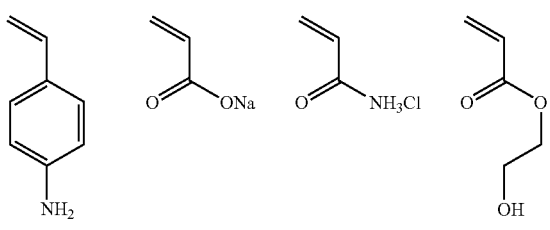
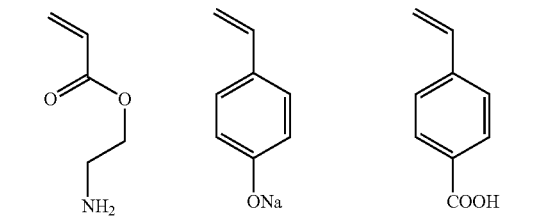

In these monomers, each hydrogen atom may be substituted with $CH_3$, F, $CF_3$, $OCF_3$, $OCH_3$, alkyl group or alkenyl group, and the present invention is not limited to these examples.

Further, the polymer compound of the present invention may be used by mixing with another polymer compound. Such another polymer compound is preferably a compound similar to the compound of the invention, a polymer compound having a carrier transporting property such as PVK or PPV, or a polymer compound capable of improving thee film forming property.

In the following, there will be explained the spacer portion $R_1$ featuring the polymer compound of the present invention.

In case of polymerizing a monomer having metal complex portion, the metal complex portion is far larger than the reactive group constituting a reaction point. Consequently, in case where the spacer portion is too short, the ligand will hide the reaction point to hinder the polymerization, whereby the reaction yield is lowered. On the other hand, in case where the spacer is too long, methylene groups constituting the spacer will be entangled by molecular movement in the reaction solution, thereby lowering the reactivity of the reaction point.

Consequently, the spacer $R_1$ which is a portion constituting a reactive group is required not to conjugate with the ligand and to have a suitable length. For these reasons, the length (number) of methylene groups in $R_1$ is preferably about 2 to 15, more preferably about 2 to 10. The ligand is not particularly limited as long as it can coordinate with a metal.

Also, according to the present invention, by the introduction of the spacer portion $R_1$ based on the aforementioned theory, it is facilitated to introduce a predetermined metal complex with a predetermined molar ratio into the polymer compound by a copolymerization reaction utilizing a monomer having the metal complex.

Also, in case of preparing an organic EL element with the polymer compound of the present invention, there can be prepared a light emitting layer capable of exploiting the full light-emitting ability thereof, since the concentration extinction scarcely occurs even in case where the layer is constituted of a single kind of compound.

Furthermore, in the polymer compound of the present invention, the light emission wavelength can be arbitrarily selected by the type of the light emitting complex to be added to the side chain, and the light emission of plural colors can be obtained by introducing plural kinds of light emitting portions. Thus, there can be obtained an advantage that the color adjustment is made possible in the level of the compound.

In the following, the present invention will be further clarified by examples, but the present invention is not limited to such examples.

EXAMPLES

In the following examples, iridium (Ir) complexes were principally employed as the metal complex.

Example 1

An Ir monomer metal complex compound of the present invention can be obtained through a synthesis flow chart shown below.

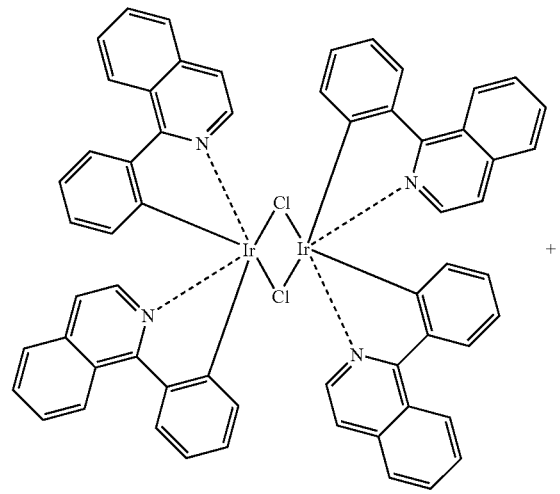

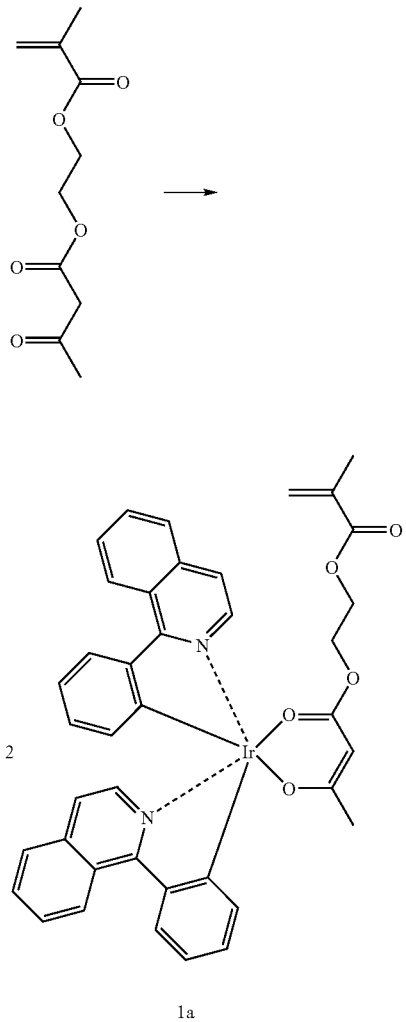

Specifically, in a 200 ml 3-necked flask, 60 ml of ethoxyethanol, 0.76 g (0.6 mole) of tetrakis[1-phenylisoquinoline-$C^2$, N]($\mu$-dichloro)diiridium(III), 0.38 g (1.8 mmol) of acetoacetoxyethyl methacrylate (manufactured by Tokyo Kasei Co.), 0.84 of sodium carbonate, and 0.0005 g of benzene-1,4-diol (hydroquinone) were charged, agitated for 1 hour in a nitrogen flow at room temperature, and then heated under agitation for 4 hours at 100° C. The reaction product was cooled with ice, then 50 ml of water were added, and a precipitate was separated by filtration and washed with water. The precipitate was washed with 30 ml of ethanol, then dissolved in chloroform, and, after removal of insoluble matters, purified by recrystallization with chloroform/methanol to obtain 0.55 g (yield 54%) of the compound 1a in red powder.

The M+ of 813 of this compound was confirmed by means of a mass spectrometer (MALDI-TOF MS).

Separately, this compound was dissolved in toluene and was subjected to a measurement of photoluminescence by use of Hitachi F-4500, with the result that the obtained emission spectrum showed $\lambda$max at 625 nm.

[Polymerization Reaction]

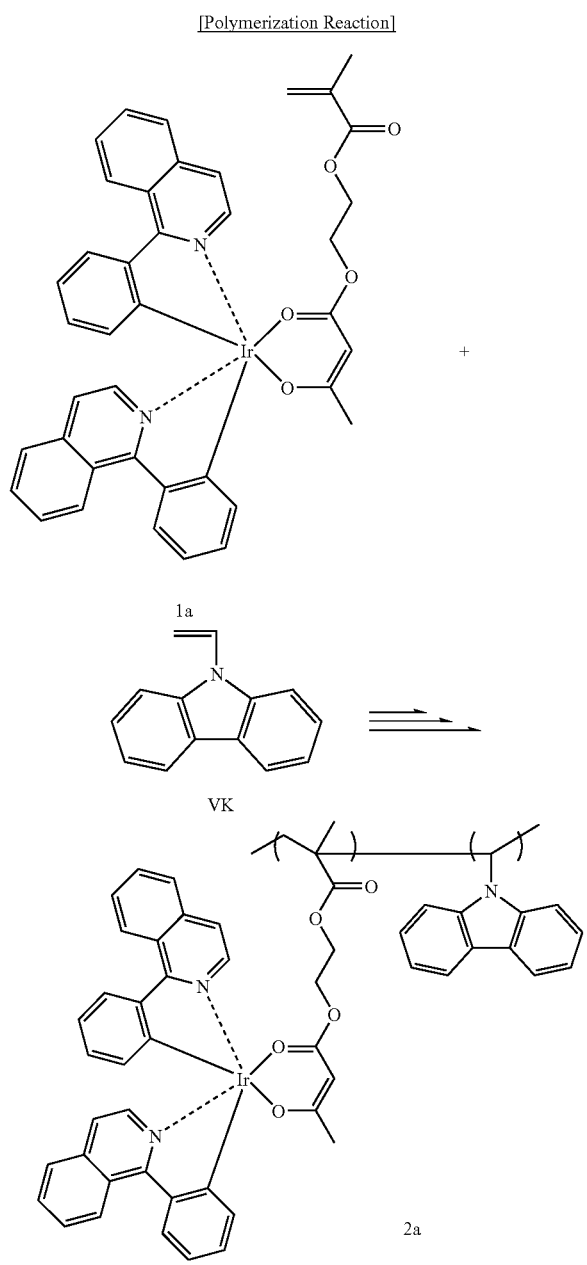

In a polymerization tube, 2 ml of N,N'-dimethyl formamide, 83 mg (0.1 mmol) of the compound 1a, 174 mg (0.9 mmol) of VK (vinylcarbazole), and 1.64 mg (0.001 mmol) of AIBN (2,2'-azobis(isobutylonitrile) were charged, and, after degassing and sealing, were heated under agitation for 20 hours at 60° C. After the reaction completed, the reaction mixture was re-precipitated three times from 100 ml of ether, and obtained powder was dried under heating at a reduced pressure to obtain 0.2 g of the compound 2a (Mn=40,000; Mw/Mn=1.4 (in THF, converted in terms of polystyrene standard)). The molar ratio of the introduction rate of the compound 1a and VK was about 1:29 by means of $^1$H-NMR.

Example 2

A monomer was synthesized following the same procedure as Example 1 with the exception that 1-(4-octylphenyl) isoquinoline was employed instead of 1-phenylisoquinoline employed in Example 1. The yield was 50%, and an M+ value 1038 of this compound was confirmed by means of MALDI-TOF MS. A toluene solution of this compound showed an emission spectrum with λmax at 624 nm.

This compound was subjected to polymerization at the same molar ratio as in Example 1, to obtain a polymer compound (Mn=52,000; Mw/Mn=1.4 (in THF, converted in terms of polystyrene standard)).

Example 3

A monomer was synthesized following the same procedure as Example 1 with the exception that 2-phenylpyridine was employed instead of 1-phenylisoquinoline employed in Example 1. The yield was 60%, and an M+ value 714 of this compound was confirmed by means of MALDI-TOF MS. A toluene solution of this compound showed an emission spectrum with λmax at 520 nm.

This compound was subjected to polymerization at the same molar ratio as in Example 1, to obtain a polymer compound (Mn=39,000; Mw/Mn=1.3 (in THF, converted in terms of polystyrene standard)).

Example 4

A monomer was synthesized following the same procedure as Example 1 with the exception that 2-(4-octylphenyl) pyridine was employed instead of 1-phenylisoquinoline employed in Example 1. The yield was 50%, and an M+ value 938 of this compound was confirmed by means of MALDI-TOF MS. A toluene solution of this compound showed an emission spectrum with λmax at 518 nm.

This compound was subjected to polymerization at the same molar ratio as in Example 1, to obtain a polymer compound.

Example 5

A monomer was synthesized following the same procedure as Example 1 with the exception that 2-(2,4-difluorophenyl)-4-methylpyridine was employed instead of 1-phenylisoquinoline employed in Example 1. The yield was 60%, and an M+ value 814 of this compound was confirmed by means of MALDI-TOF MS. A toluene solution of this compound showed an emission spectrum with λmax at 470 nm.

This compound was subjected to polymerization at the same molar ratio as in Example 1, to obtain a polymer compound (Mn=35,000; Mw/Mn=1.3 (in THF, converted in terms of polystyrene standard)).

Example 6

A monomer was synthesized following the same procedure as Example 1 with the exception that 2-(9,9-dimethyl-9H-fluorene-2-yl)-pyridine was employed instead of 1-phenylisoquinoline employed in Example 1. The yield was 40%, and an M+ value 946 of this compound was confirmed by means of MALDI-TOF MS. A toluene solution of this compound showed an emission spectrum with λmax at 550 nm.

This compound was subjected to polymerization at the same molar ratio as in Example 1, to obtain a polymer compound (Mn=35,000; Mw/Mn=1.3 (in THF, converted in terms of polystyrene standard)).

Example 7

A monomer was synthesized following the same procedure as Example 1 with the exception that 2-benzylpyridine was employed instead of 1-phenylisoquinoline employed in Example 1.

Example 8

A monomer was synthesized following the same procedure as Example 1 with the exception that 1-(4-fluorophenyl)isoquinoline was employed instead of 1-phenylisoquinoline employed in Example 1.

Example 9

A monomer obtained by following the procedure of Example 1 with the exception that 1-(4-octylphenyl)isoquinoline was employed instead of 1-phenylisoquinoline for the monomer 1a, and a monomer obtained by following the procedure of Example 1 with the exception that 2-(2,4-difluorophenyl)-4-methylpyridine instead of 1-phenylisoquinoline for the monomer 1a were used to effect polymerization in a molar ratio of 8:2 and in a total amount of 0.1 mmol with the other materials being used in the same molar ratios as explained above, so that a polymer compound (Mn=28,000; Mw/Mn=1.3 (in THF, converted in terms of polystyrene standard)) was obtained.

Example 10

A polymerization reaction was carried out in the same molar ratio as Example 1 with the exception that 65 mg (0.9 mmol) of acrylic acid was employed instead of vinylcarbazole to obtain a polymer compound (Mn=15,000; Mw/Mn=1.3 (in THF, converted in terms of polystyrene standard)).

Example 11

The compound obtained in Example 1 was employed in the preparation of a single-bit organic EL element the organic layer of which was constituted of the three layers, namely a hole transporting layer, a light emitting layer and an electron transporting layer, and the characteristics of the element were measured.

The element is schematically shown in FIG. 1. An alkali-free glass substrate was employed as a transparent substrate 11, and, on the substrate, was formed indium tin oxide (ITO) in a thickness of 100 nm by sputtering as a transparent electrode 12 serving as an anode and was patterned into a stripe shape of a width of 3 mm.

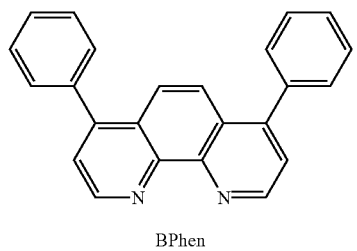

BPhen

-continued

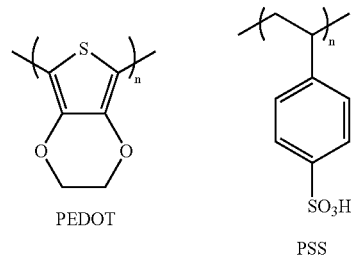

PEDOT

PSS

A hole transporting layer 13 was formed thereon in a thickness of 30 nm by spin coating of a 1.3 wt. % aqueous solution of a mixture of PEDOT and PSS represented by the foregoing chemical formulas, employing Aldrich Model 48309-5. Then, a light emitting layer 14 was formed by plural times of spin coating of a 1.0% chloroform solution of the polymer compound 2a of Example 1, followed by drying for 60 minutes in an oven of 60° C. to attain a film thickness of 30 nm. Then, an electron transporting layer 15 was formed by resistance-heated evaporation of Bphen compound of the foregoing structure in vacuum of $10^{-4}$ Pa in a film thickness of 40 nm.

Then, potassium fluoride (KF) was provided in a thickness of 5 nm as an underlying layer for a metal electrode layer. Then, a metal electrode 16 serving as a cathode was formed by evaporating an aluminum (Al) film of a thickness of 100 nm and patterning the film with a width of 3 mm so as to be perpendicular to the transparent electrode, whereby an organic EL element with an electrode area of 9 mm² was prepared.

In order to investigate the characteristics of thus prepared organic EL element, the current-voltage characteristics were measured with a microammeter 4140B manufactured by Hewlett-Packard Co., and the luminance of light emission was measured by Model BM7 manufactured by TOPCON CORP. As a result, the element of this example prepared using the compound of Example 1 showed a satisfactory rectifying property.

Further, a light emission from this EL element was confirmed under application of a voltage of 15 V. In this example, there was confirmed a light emission of red color, having a maximum light emission wavelength derived from a 1-phenylisoquinoline-Ir complex, presumably resulting from the compound 1a of Example 1.

The phosphorescence emitting element employing the polymer compound of the present invention can utilize the polymer compound in a state capable of exploiting the full light emitting ability thereof in the light emitting layer, and provides advantages of stabilizing the composition of the light emitting layer and reducing the fluctuation in luminance of the prepared element, in contrast to the conventional low-molecular light emitting material prepared by doping a host material.

This is because, in the polymer compound of the present invention, the light emitting portions are located in a dispersed state in the polymer, thereby reducing the energy transfer to adjacent light emitting portions and can therefore be utilized with a full light emitting ability.

Example 12

An organic EL element was prepared following the same procedure as Example 11 with the exception that the compound of Example 3 was employed instead of the compound of Example 1 employed in Example 11. As a result of inspection for the light emission, there was confirmed a light emission of green color, having a maximum light emission wavelength derived from a 2-phenylpyridine-Ir complex.

Example 13

An organic EL element was prepared following the same procedure as Example 11 with the exception that the compound of Example 5 was employed instead of the compound of Example 1 employed in Example 11. As a result of inspection for the light emission, there was confirmed a light emission of blue color, having a maximum light emission wavelength derived from a 2-(2,4-difluorophenyl)-4-methylpyridine-Ir complex.

Example 14

An organic EL element was prepared following the same procedure as Example 11 with the exception that a solution of a mixture of the compound of Example 5 and the compound of Example 6 in a weight ratio of 9:1 was employed instead of the compound of Example 1 employed in Example 11. As a result of inspection for the light emission, there was confirmed a light emission of white color, having maximum light emission wavelengths derived from a 2-(2,4-difluorophenyl)-4-methylpyridine-Ir complex and a 2-(9,9-dimethyl-9H-fluorene-2-yl)-pyridine-Ir complex.

Example 15

An organic EL element was prepared following the same procedure as Example 11 with the exception that the compound of Example 9 was employed instead of the compound of Example 1 employed in Example 11. As a result of inspection for the light emission, there was confirmed a light emission, having maximum light emission wavelengths derived from a 1-(4-octylphenyl)isoquinoline-Ir complex and a 2-(2,4-difluorophenyl)-4-methylpyridine-Ir complex.

Example 16

An organic EL element was prepared following the same procedure as Example 11 with the exception that a mixture of the compound of Example 1 and polyvinylcarbazole of the following structure in a weight ratio of 1:1 was employed instead of the compound of Example 1 employed in Example 11. As a result, there was confirmed a light emission of red color, having a maximum light emission wavelength derived from a 1-phenylisoquinoline-Ir complex, presumably resulting from the compound 1a.

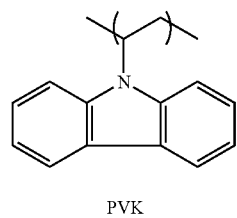

PVK

In order to confirm that the obtained light emission was phosphorescence, the polymer compound employed in Example 9 was dissolved in chloroform, and the photoluminescence was compared in a solution subjected to replacement with oxygen and a solution subjected to replacement with nitrogen. As a result, the solution after oxygen replacement scarcely showed light emission derived from the iridium complex, while the solution after nitrogen replacement provided photoluminescence derived from the iridium complex. It was confirmed from these results that the polymer compound of the present invention had phosphorescent property.

In general, the fluorescent materials have a light emission lifetime of several to several tens of nanoseconds, the polymer compounds of the present invention each had a phosphorescence lifetime of 100 ns or more.

Also, in the present invention, it is possible to obtain a light emission element of a wide light-emission wavelength range by doping a polymer compound with light emitting materials of different light emission wavelengths.

The electroluminescent element of the present invention shows a high light emitting efficiency, and is applicable to products requiring energy saving or a high luminance. Examples of such application include a white color illuminating apparatus, a full-color display apparatus, and so on.

In the application to a display apparatus, an XY matrix element and a element of active matrix type provided with thin film transistors (TFT) are suitable. Also the active element is not particularly limited and application is possible to single-crystal silicon substrates, MIM elements, amorphous silicon (a-Si) TFTs, and so on.

In case of employing the phosphorescence emitting material utilizing the novel polymer-metal complex of the present invention, there can easily be obtained an organic EL element having a high light emitting efficiency and showing light emission of blue to red colors or white color by means of the spin coating method or ink jet method. In particular, it is possible to introduce plural kinds of metal complexes at a specified proportion into a single polymer compound, thereby obtaining light emission of white color or a desired color.

What is claimed is:

1. A polymer compound having a main chain and at least one side chain wherein at least one of said side chain comprises a partial structure represented by the general formula (1):

wherein $R_1$ is (a) a linear or branched alkylene group having 2 to 15 carbon atoms in which only a single methylene group or two or more non-adjacent methylene groups may be substituted with —O—, —S—, —CO—, —CO—O—, —O—CO—, —CH=CH—, or —C≡C—, and in which a hydrogen atom of said alkylene group is optionally substituted by a fluorine atom, or (b) an aromatic ring group optionally substituted with a halogen atom, a cyano group, a nitro group or a linear or branched alkyl group having 1 to 20 carbon atoms in which only a single methylene group or two or more non-adjacent methylene groups are optionally substituted with —O—, —S—, —CO—; —CO—O—, —O—CO—, —CH=CH—, or —C≡C—, and a hydrogen atom of the alkyl group is optionally substituted with fluorine atom;

M is Ir;

L and L' are different and are each a ligand coordinatable with a metal, wherein L' comprises a partial structure represented by the formula:

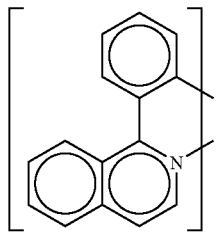

and n is 1 or 2.

2. The polymer compound according to claim 1, wherein all the side chains each comprise the partial structure represented by the general formula (1).

3. The polymer compound according to claim 1, comprising a side chain comprising the partial structure represented by the general formula (1) and a different side chain.

4. An electroluminescent element comprising a pair of electrodes, and at least one organic layer provided between the pair of electrodes and comprising the polymer compound set forth in claim 1.

5. The electroluminescent element according to claim 4, which emits a red light.

6. An electroluminescent element comprising a pair of electrodes, and at least one organic layer provided between the pair of electrodes and comprising the polymer compound set forth in claim 2.

7. An electroluminescent element comprising a pair of electrodes, and at least one organic layer provided between the pair of electrodes and comprising (i) the polymer compound set forth in claim 2, and (ii) a second polymer compound.

8. The electroluminescent element according to claim 7, which emits a white light.

9. An electroluminescent element comprising a pair of electrodes, and at least one organic layer provided between the pair of electrodes and comprising the polymer compound set forth in claim 3.

* * * * *